(12) United States Patent
Chen

(10) Patent No.: US 7,824,970 B2
(45) Date of Patent: Nov. 2, 2010

(54) SEMICONDUCTOR STRUCTURE AND METHOD FOR MANUFACTURING THE SAME

(75) Inventor: Yu-Cheng Chen, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/781,135

(22) Filed: May 17, 2010

(65) Prior Publication Data

US 2010/0221859 A1    Sep. 2, 2010

Related U.S. Application Data

(62) Division of application No. 12/339,371, filed on Dec. 19, 2008, now Pat. No. 7,750,346.

(30) Foreign Application Priority Data

Jul. 4, 2008    (TW) ............................. 97125284 A

(51) Int. Cl.
*H01L 21/00* (2006.01)
*H01L 21/84* (2006.01)

(52) U.S. Cl. ............. 438/149; 438/155; 257/E21.32; 257/E21.561

(58) Field of Classification Search .............. 438/149, 438/151, 154, 155, 163, 199; 257/E21.32, 257/E21.561, E21.7
See application file for complete search history.

(56) References Cited

U.S. PATENT DOCUMENTS 6,949,417 B1 * 9/2005 Ahn ........................... 438/149
2008/0017859 A1   1/2008 Tai et al.

\* cited by examiner

*Primary Examiner*—Hoai v Pham
(74) *Attorney, Agent, or Firm*—Thomas, Kayden, Horstemeyer & Risley, LLP

(57) ABSTRACT

A semiconductor structure and a method for manufacturing the same are provided. Compared to conventional structures of thin film transistors, the structure of the present invention uses a patterned first metal layer as a data line, and a patterned second metal layer as a gate line. In a thin film transistor, a gate is also located in the patterned first metal layer, and is electrically connected to the gate line located in the patterned second metal layer through a contact hole. A source and a drain of the thin film transistor are electrically connected to the data line through a contact hole. The structure of the present invention increases a storage capacitance and an aperture ratio.

16 Claims, 6 Drawing Sheets

SEMICONDUCTOR STRUCTURE AND METHOD FOR MANUFACTURING THE SAME

CROSS-REFERENCES TO RELATED APPLICATIONS

This application is a divisional of U.S. application Ser. No. 12/339,371, filed Dec. 19, 2008, which claims the benefit from the priority of Taiwan Patent Application No. 097125284 filed on Jul. 4, 2008, the disclosures of which are incorporated by reference herein in their entirety.

BACKGROUND OF THE INVENTION

1. Field of the Invention

The present invention relates to a semiconductor structure and a method for manufacturing the same. More particular, the present invention relates to a low-temperature polysilicon thin film transistor structure for a liquid crystal display with a high aperture ratio and a method for manufacturing the same.

2. Descriptions of the Related Art

Low luminance has been a key issue for thin film transistor liquid crystal displays (TFT-LCDs). As a result, efforts to improve the aperture ratio of pixels have been made over recent years. The aperture ratio refers to the ratio of the light-transmissive area to the total area in a TFT-LCD. A high aperture ratio allows more light to be projected outwards sufficiently and efficiently with less light loss in the TFT liquid crystal panel. Hence, the higher the aperture ratio is, the more light will be transmitted. Accordingly, many manufacturers are developing new manufacturing processes to improve the aperture ratio of TFT-LCDs in expectation of providing both high luminance and low power consumption.

A conventional pixel structure with a high aperture ratio in an LCD is depicted in FIG. 1. In this pixel structure, the data line 11 is comprised of a first metal layer 111 and a second metal layer 112. In the semiconductor manufacturing process, different metal layers are formed at different levels. To interconnect the different metal layers, contact holes are opened in the dielectric interlayer between these metal layers at positions where these metal layers are overlapped with each other, so that the metal layers may be electrically interconnected through the contact holes. Commonly, the contact holes between metal layers are generally termed as "vias" for distinguishing purposes. In FIG. 1, the data line 11 has contact holes 113, 114 to electrically interconnect the first metal layer 111 and the second metal layer 112 and to have the data line 11 cross over another line 115 formed in the first metal layer 111 for vertical electrical conduction.

To ensure that the electrical connection characteristics between the metal layers (e.g., impedance) are not disturbed by the contact holes, the dimensions of the contact holes must comply with specific design rules. In general, the opening dimension of the contact hole must be wide enough to avoid excessively high connection impedance. Meanwhile, there is also a risk of wire breakage because the metal layers are electrically connected via a contact hole.

As described above and illustrated in the pixel structure of FIG. 1, the two contact holes must inevitably be opened in the data line. Because the contact holes 113, 114 must be formed into a specific size to maintain appropriate connection impedance, the aperture ratio of the pixel structure will inevitably be reduced by forming the contact holes 113, 114. Meanwhile, because the two contact holes 113, 114 are formed in the data line 11, the risk of wire breakage is increased for the data line 11. In other words, when the first and the second metal layers 111, 112 are interconnected via the contact holes, wire breakage may occur in the data line 11 due to yield control variation of the manufacturing process, making it impossible to maintain electrical connection.

Accordingly, efforts still have to be made in the art to provide a semiconductor structure that delivers a high aperture ratio in an LCD and to also ensure satisfactory electrical characteristics of the pixel structures in the LCD.

SUMMARY OF THE INVENTION

One objective of this invention is to provide a semiconductor structure for a flat panel display. In this semiconductor structure, by using a patterned first metal layer as both a gate electrode and a data line and using a patterned second metal layer as a gate line and a common electrode, it is unnecessary to form the data line by electrically connecting the first metal layer and the second metal layer via a contact hole. Thus, the number of contact holes is decreased and the aperture ratio is improved.

Another objective of this invention is to provide a semiconductor structure for a flat panel display, which connects both a semiconductor layer and a first metal layer via a single contact hole. Thus, the number of contact holes is decreased and the aperture ratio is improved.

This invention discloses a semiconductor structure comprising a semiconductor layer, a patterned first metal layer and a patterned second metal layer. The patterned first metal layer comprises a gate electrode partially disposed on a portion of the semiconductor layer and a data line partially disposed on the semiconductor layer. The patterned second metal layer comprises a gate line partially disposed on a portion of the gate electrode and electrically connected to the gate electrode, while a common electrode is partially disposed on a portion of the data line. With this arrangement, the gate electrode and the gate line of the semiconductor structure may be formed by electrically connecting the first metal layer and the second metal layer. The data line is formed only by the first metal layer, while the common electrode is only formed by the second metal layer. This may improve the aperture ratio of the semiconductor structure and reduce the number of contact holes.

Another objective of this invention is to provide a method for manufacturing a semiconductor structure, comprising the following steps: (1) forming a semiconductor layer on a substrate, in which the semiconductor layer has a source area and a drain area; (2) forming a patterned first dielectric layer on the semiconductor layer; (3) forming a patterned first metal layer on the patterned first dielectric layer, in which the patterned first metal layer has a data line and a gate electrode partially formed on the semiconductor layer respectively; (4) forming a patterned second dielectric layer on the patterned first metal layer to define a first contact hole, a second contact hole, and third contact hole, wherein the first contact hole exposes a portion of the source area and a portion of the data line, the second contact hole exposes a portion of the drain area, and the third contact hole exposes a portion of the gate electrode; and (5) forming a patterned second metal layer on the patterned second dielectric layer, in which the patterned second metal layer has a gate line, a common electrode, a source line and a drain line. The gate line is partially formed on the gate electrode and is electrically connected to the gate electrode through the third contact hole. The common electrode is partially formed on the data line, while the source line covers the first contact hole and is electrically connected to the data line and the source area. The drain line covers the second contact hole and is electrically connected to the drain area.

Yet a further objective of this invention is to provide a method for manufacturing a semiconductor structure, comprising the following steps: (1) forming a semiconductor material layer on a substrate; (2) patterning the semiconductor material layer to form a semiconductor layer, in which the semiconductor layer has a source area and a drain area; (3) forming a first dielectric layer and a first metal layer sequentially on the substrate and on the semiconductor layer; (4) forming a data line and a gate electrode on a portion of the semiconductor layer by patterning the first metal layer; (5) forming a second dielectric layer to cover the data line and the gate electrode; (6) forming a first contact hole, a second contact hole, and a third contact hole by patterning the second dielectric layer and the first dielectric layer, wherein the first contact hole exposes a portion of the source area and a portion of the data line, the second contact hole exposes a portion of the drain area, and the third contact hole exposes a portion of the gate electrode; (7) forming a second metal layer to cover the second dielectric layer inside the first contact hole, the second hole and the third contact hole; (8) collaterally forming a gate line electrically connected to the gate electrode, a source line electrically connected to the data line and the source area, a drain line electrically connected to the drain area, and a common electrode located on a portion of the data line by patterning the second metal layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, this invention will be explained with reference to embodiments thereof. This invention relates to a semiconductor structure and a method for manufacturing the same for a flat panel display. By rearranging a plurality of patterned metal layers of the semiconductor structure and connecting both a semiconductor layer and a patterned metal layer via a single contact hole, the number of contact holes is reduced and the aperture ratio is improved. However, these embodiments are not intended to limit this invention to any specific environment, applications or particular implementations described in these embodiments. Therefore, the description of these embodiments is only for purpose of illustration but not limitation. It should be appreciated that in the following embodiments and the attached drawings, elements not related directly to this invention are omitted from depiction. For ease of understanding, the dimensional relationships among individual elements in the attached drawings are illustrated in a slightly exaggerated scale. In the top view of the semiconductor structure, the lower layers are depicted in dashed lines because of the stacked arrangement.

Figure 1:
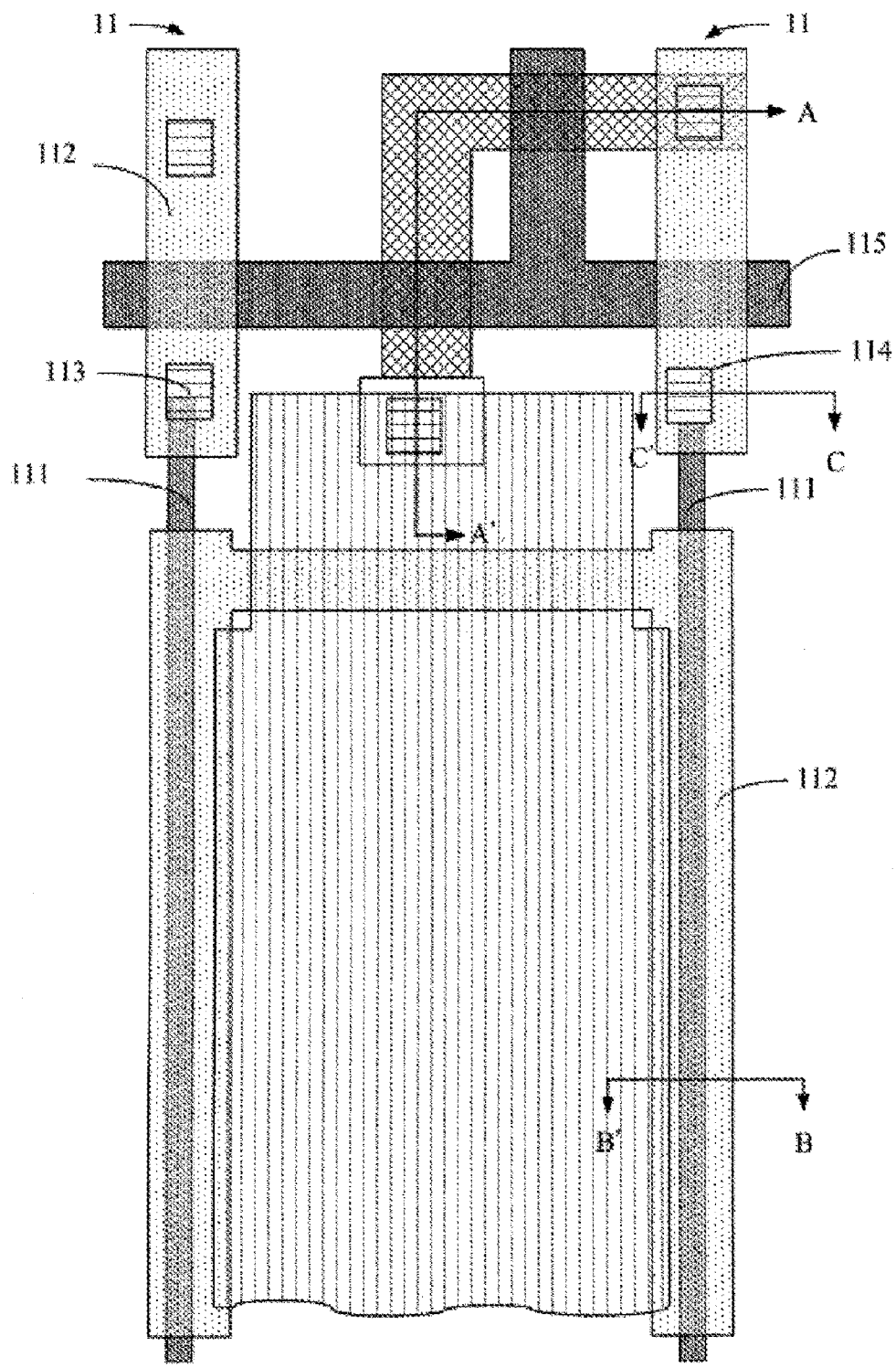
FIG. 1 is a schematic view of a conventional pixel structure with a high aperture ratio in an LCD.
Figure 2A:
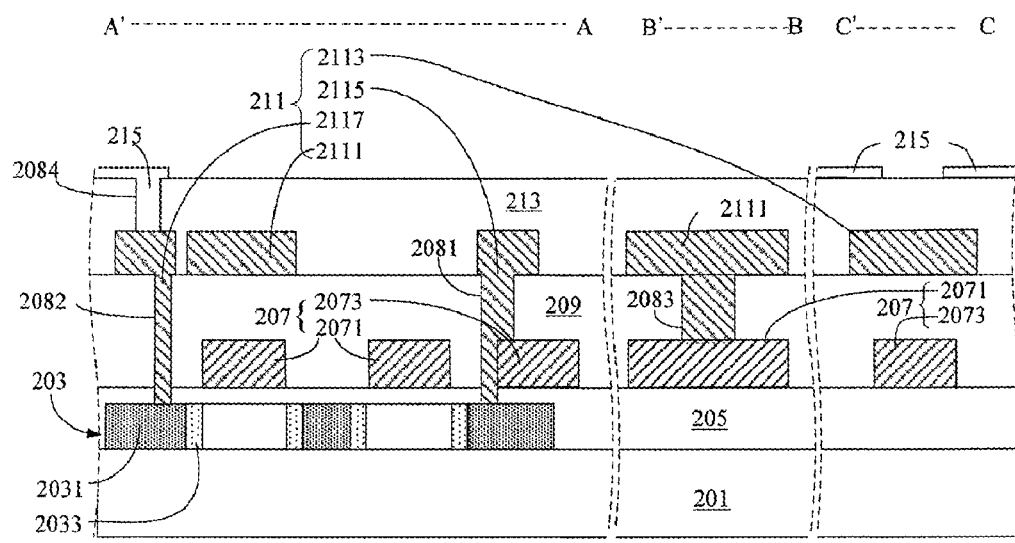
FIG. 2A is a cross-sectional view of the preferred embodiment of this invention.
Figure 2B:
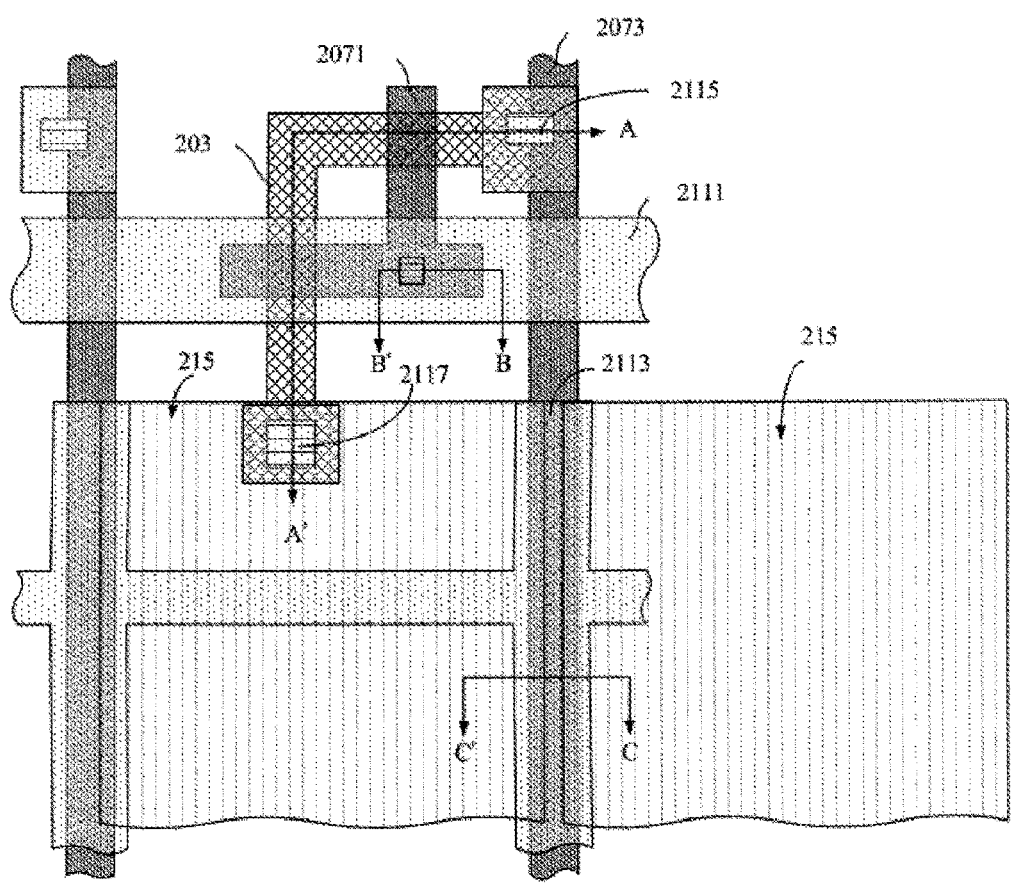
FIG. 2B is a top view of the preferred embodiment of this invention.

In reference to both FIGS. 2A and 2B together, FIG. 2B is a top view of a semiconductor structure depicted in FIG. 2A. In FIG. 2A, sections A-A', B-B' and C-C' are taken along lines A-A', B-B' and C-C' shown in FIG. 2B respectively. It should be noted that the section A-A' corresponds to a plotline because the semiconductor structures have inseparable characteristics even though no metal layer exists at the turning point of the plotline. Therefore, section A-A' is taken along a plotline for ease of understanding. FIG. 2A illustrates a schematic cross-sectional view of the semiconductor structure of this invention. For convenience of explanation, the above elements are depicted in a single cross-sectional view and are divided by division lines into section A-A', section B-B' and section C-C' respectively. The semiconductor structure of this invention comprises a semiconductor layer 203, a patterned first dielectric layer 205, a patterned first metal layer 207, a patterned second dielectric layer 209, a patterned second metal layer 211, a patterned third dielectric layer 213 and a pixel electrode 215.

Further shown in FIG. 2A, the semiconductor layer 203, which is disposed on a substrate 201, comprises a source area and a drain area. Both of the source area and the drain area have a heavily doped area 2031 and, in the inside thereof, a lightly doped area 2033. The semiconductor layer 203 is generally made of a material comprising polysilicon. The patterned first dielectric layer 205 is disposed on the semiconductor layer 203 to cover the semiconductor layer 203. The patterned first metal layer 207 is disposed on the patterned first dielectric layer 205, and comprises a gate electrode 2071 partially disposed on a portion of the semiconductor layer 203 and a data line 2073 partially disposed on the semiconductor layer 203. It can be seen from this figure that the patterned first dielectric 205 and the patterned second dielectric layer 209 are formed with a first contact hole 2081, a second contact hole 2082 and a third contact hole 2083 for electrically connecting the semiconductor layer 203, the patterned first metal layer 207 and the patterned second metal layer 211.

The patterned second dielectric layer 209 is disposed on the patterned first metal layer 207, while the patterned second metal layer 211 is in turn disposed on the patterned second dielectric layer 209. The patterned second metal layer 211 comprises a gate line 2111 partially disposed on a portion of the gate electrode 2071 and electrically connected to the gate electrode 2071, a common electrode 2113 partially disposed on a portion of the data line 2073, a source line 2115 electrically connected to the source area of the semiconductor layer 203 and the data line 2073, and a drain line 2117 electrically connected to the drain area of the semiconductor layer 203.

It should be noted that, as can be seen in FIG. 2A, the source line 2115 is electrically connected to the data line 2073 and the source area via the first contact hole 2081; i.e., the data line 2073 and the source area can be electrically connected to the patterned second metal layer 211 together through only the first contact hole 2081, thus reducing the number of contact hole requirement. This may not only reduce the risk of wire breakage, but also improve the aperture ratio. Meanwhile, the drain line 2117 is electrically connected to the drain area via the second contact hole 2082, while the gate line 2111 is electrically connected to the gate electrode 2071 via the third contact hole 2083. In reference to FIG. 2B, it can be seen that the data line 2073 also entirely consists of the patterned first metal layer 207; i.e., the data line 2073 may only consist of a metal layer without one more contact hole requirement for connecting a plurality of metal layers. Likewise, this reduces the risk of wire breakage and improves the aperture ratio.

The patterned third dielectric layer 213 of the semiconductor structure is disposed on the patterned second metal layer 211, while the pixel electrode 215 is in turn disposed on the patterned third dielectric layer 213 and electrically connected to the drain line 2117 via the fourth contact hole 2084. Thus, the common electrode 2113 and the pixel electrode 215 are partially overlapped with each other to compose of a storage capacitor. Aside from improving the aperture ratio, this may also increase the capacitance of the storage capacitor.

Furthermore, in the structure described above, the common electrode 2113 formed by the patterned second metal layer 211 also overlaps the data line 2073 to prevent from generating an electric field when a signal is transmitted through the data line 2073 to mitigate the influence of the data line 2073 on an electric field generated between the pixel electrode 215 and the data line 2073.

Hence, apart from reducing the number of contact holes to reduce the risk of wire breakage and to improve the aperture ratio, this invention may also increase the capacitance of the storage capacitor and prevent from generating the electric field between the data line 2073 and the pixel electrode 215.

Figure 2C:
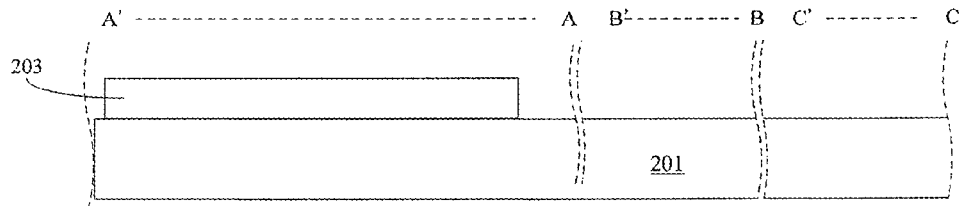
FIG. 2C~2H illustrate a schematic flow diagram of a process for manufacturing a semiconductor structure of this invention.
Figure 2D:
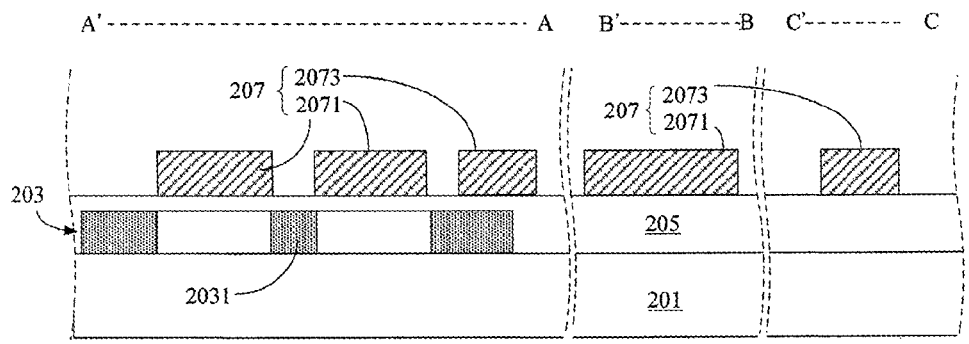
Figure 2E:
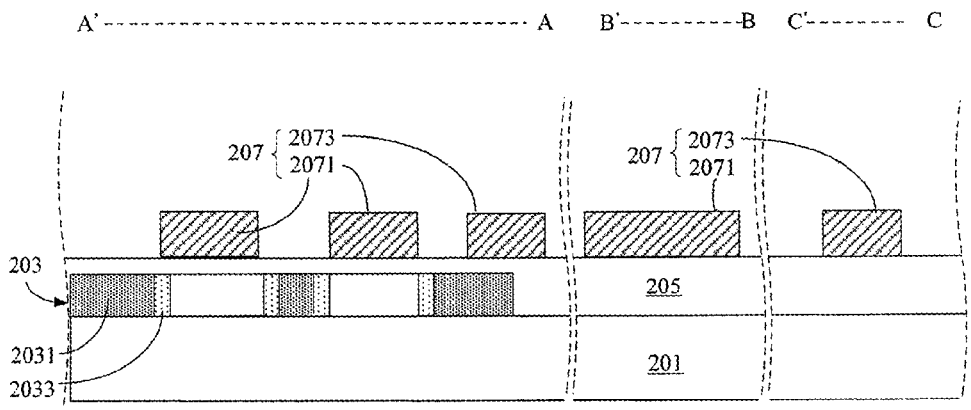
Figure 2F:
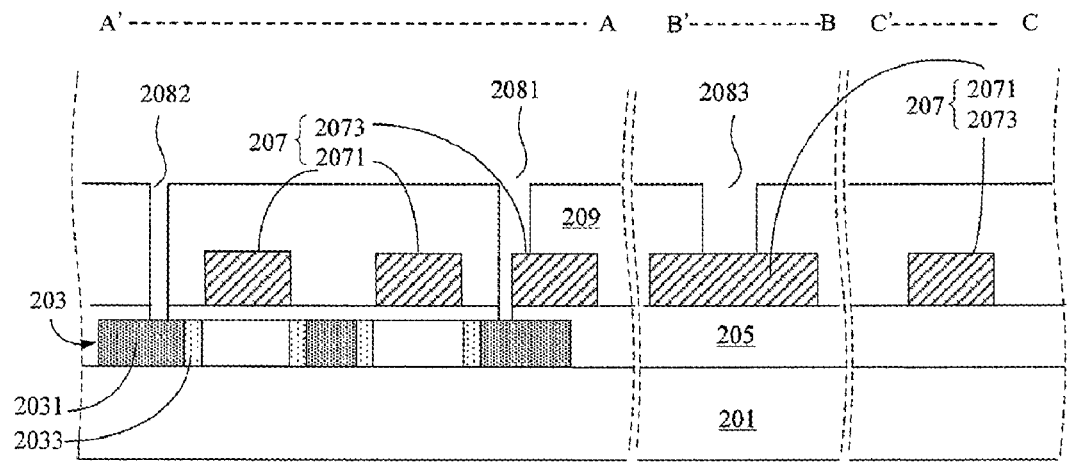
Figure 2G:
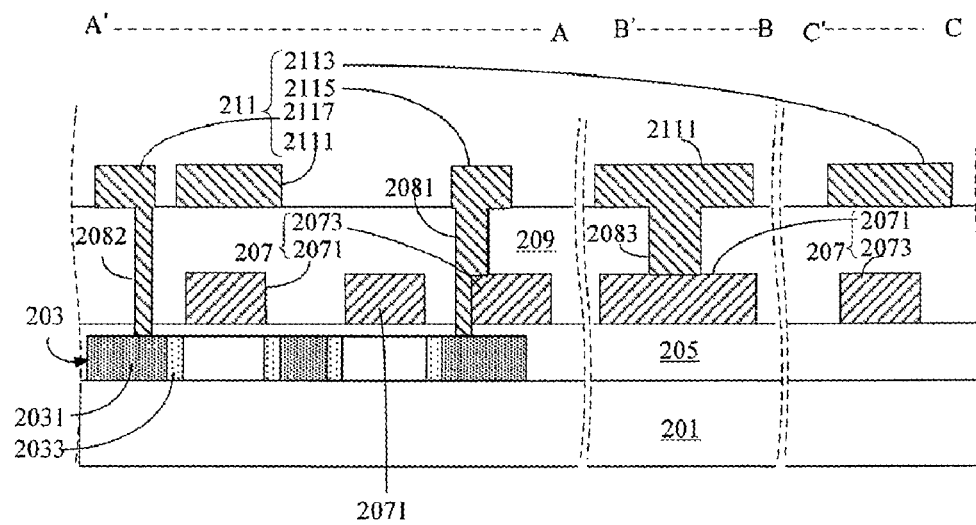
Figure 2H:
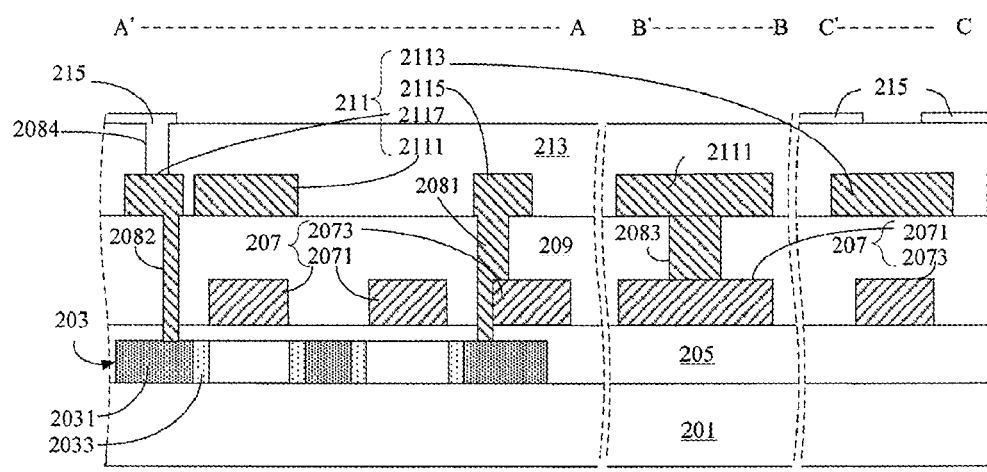

FIGS. 2C to 2H illustrate a process flow of a method for manufacturing a semiconductor structure of this invention, in which the semiconductor structure depicted in FIG. 2H is just the embodiment depicted in FIG. 2A.

As shown in FIG. 2C, a semiconductor layer 203 is formed on the substrate 201. A structure with a source area and a drain area is to be formed in the semiconductor layer 203 in subsequent processes. Next, as shown in FIG. 2D, a patterned first dielectric layer 205 is formed on the semiconductor layer 203, and a patterned first metal layer 207 is then formed on the patterned first dielectric layer 205. The patterned first metal layer 207 comprises a data line 2073 and a gate electrode 2071 formed on a portion of the semiconductor layer 203 respectively. The first dielectric layer 205 and the first metal layer 207 are sequentially formed on the substrate 201 and the semiconductor layer 203. The patterned first metal layer 207 may be formed through thin-film, lithographic and etching processes. In this embodiment, the gate electrode 2071 may be used as a mask to carry out a heavily doping process on the semiconductor layer 203 to form a heavily doped area 2031 for use as a source area and a drain area. Next, as shown in FIG. 2E, an outer wall of the gate electrode 2071 is partially removed, for example, through an etching process, to make the gate electrode 2071 slightly smaller than the original size. Subsequently, the etched gate electrode 2071 is used as a mask to carry out a lightly doping process on the semiconductor layer 203 to form a lightly doped area 2033 at the inside of the source area and the inside of the drain area respectively.

The above embodiment fully uses the gate electrode 2071 as a mask, and the process of forming the doping areas features a self-aligning capability. In other embodiments, other processes may also be used to form the heavily doped area 2031 and the lightly doped area 2033. For example, prior to the formation of the gate electrode 2071, one or two masking processes are used to form the heavily doped area 2031 and the lightly doped area 2033, and then the gate electrode 2071 is formed. Those skilled in the art may readily appreciate that the heavily doping process or the lightly doping process comprises at least either the P-type ion doping process or the N-type ion doping process, and the material of the semiconductor layer 203 may be made of polysilicon.

It should be noted that the gate electrodes 2071 of different areas in the above figures are electrically connected to each other, as is also the case for the data lines 2073. This may be appreciated by reference to FIG. 2B.

Next, in reference to FIG. 2F, a patterned second dielectric layer 209 is formed on the patterned first metal layer 207 to define a first contact hole 2081, a second contact hole 2082 and a third contact hole 2083. The first contact hole 2081 exposes a portion of the source area and a portion of the data line 2073, the second contact hole 2082 exposes a portion of the drain area, and the third contact hole 2083 exposes a portion of the gate electrode 2071. Here, the contact holes may be formed through various etching processes, such as plasma etching, dry etching, wet etching or the like. The technologies for forming the contact holes can be readily appreciated by those skilled in the art and thus will not be further described herein.

Next, in reference to FIG. 2G, a patterned second metal layer 211 is formed on the patterned second dielectric layer 209. The patterned second metal layer 211 comprises a gate line 2111, a common electrode 2113, a source line 2115 and a drain line 2117. The gate line 2111 is formed on a portion of the gate electrode 2071 and is electrically connected to the gate electrode 2071 via the third contact hole 2083. The common electrode 2113 is formed on a portion of the data line 2073. The source line 2115 covers the first contact hole 2081 and is electrically connected to the data line 2073 and the source area. The drain line 2117 covers the second contact hole 2082 and is electrically connected to the drain area.

It should be noted that the data line 2073 and the source area can be electrically connected via the source line 2115; i.e., the source line 2115, the data line 2073 and the source area can be electrically connected together via the first contact hole 2081 to reduce the number of contact holes.

Next, as shown in FIG. 2H, through a lithographic and an etching process, a patterned third dielectric layer 213 is further formed on the patterned second metal layer 211, and then a fourth contact hole 2084 is defined on the drain line 2117. Meanwhile, a pixel electrode 215 is formed on the patterned third dielectric layer 213 and inside the fourth contact hole 2084. The pixel electrode 215 is electrically connected to the drain line 2117, and is partially overlapped with the common electrode 2113 to compose of a storage capacitor. Thus, the semiconductor structure depicted in FIG. 2A is completed.

It follows from description of the above embodiments that the semiconductor structure of this invention and the method for manufacturing the same can reduce the number of contact holes, connecting both the semiconductor layer and the first metal layer via a single contact hole, and improve the aperture ratio.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a semiconductor structure, comprising:
   forming a semiconductor layer on a substrate, in which the semiconductor layer is provided with a source area and a drain area;
   forming a patterned first dielectric layer on the semiconductor layer;

forming a patterned first metal layer on the patterned first dielectric layer, in which the patterned first metal layer has a data line and a gate electrode partially formed on the semiconductor layer respectively;

forming a patterned second dielectric layer on the patterned first metal layer to define a first contact hole, a second contact hole, and third contact hole, wherein the first contact hole exposes portion of the source area and exposes portion of the data line, the second contact hole exposes portion of the drain area, and the third contact hole exposes portion of the gate electrode; and forming a patterned second metal layer on the patterned second dielectric layer, in which the patterned second metal layer has a gate line, a common electrode, a source line and a drain line, wherein the gate line is partially formed on the gate electrode, and the gate line is electrically connected to the gate electrode through the third contact hole, the common electrode is partially formed on the data line, the source line covers the first contact hole and is electrically connected to the data line and the source area, and the drain line covers the second contact hole and is electrically connected to the drain area.

2. The method as claimed in claim 1, further comprising:
forming a patterned third dielectric layer on the patterned second metal layer to define a fourth contact hole on the drain line; and
forming a pixel electrode on the patterned third dielectric layer and within the fourth contact hole, in which the pixel electrode is electrically connected to the drain line.

3. The method as claimed in claim 1, further comprising performing a doping process in the source area and the drain area of the semiconductor layer.

4. The method as claimed in claim 3, wherein the doping process comprises P-type ion doping process or N-type ion doping process.

5. The method as claimed in claim 1, further comprising performing a heavy doping process to make the source area and the drain area as heavy doped areas by applying the gate electrode as a mask.

6. The method as claimed in claim 5, further comprising:
removing partial outer wall of the gate electrode; and
performing a light doping process in the semiconductor layer to form light doped areas in the inside of the source area and the inside of the drain area respectively by applying etched gate electrode as a mask.

7. The method as claimed in claim 5, wherein the heavy doping process and the light doping process comprise P-type ion doping process or N-type ion doping process.

8. The method as claimed in claim 1, wherein the semiconductor is made of a polysilicon.

9. A method for manufacturing a semiconductor structure, comprising:
forming a semiconductor material layer on a substrate;
patterning the semiconductor material layer to form a semiconductor layer, the semiconductor layer being provided with a source area and a drain area;

forming a first dielectric layer and a first metal layer sequentially on the substrate and the semiconductor layer;

forming a data line and a gate electrode on portion of the semiconductor layer by patterning the first metal layer;

forming a second dielectric layer to cover the data line and the gate electrode;

forming a first contact hole, a second contact hole, and a third contact hole by patterning the second dielectric layer and the first dielectric layer, wherein the first contact hole exposes portion of the source area and portion of the data line, the second contact hole exposes portion of the drain area, and the third contact hole exposes portion of the gate electrode;

forming a second metal layer to cover the second dielectric layer and inside the first contact hole, the second hole and the third contact hole;

forming a gate line electrically connected to the gate electrode, a source line electrically connected to the data line and the source area, a drain line electrically connected to the drain area, and a common electrode on portion of the data line by patterning the second metal layer.

10. The method as claimed in claim 9, further comprising:
forming a third dielectric layer on the gate line, the source line, the drain line, and the common electrode;
forming a fourth contact hole to expose the drain line by patterning the third dielectric layer; and
forming a transparent conductive layer on the third dielectric layer and in the fourth contact hole; and
forming a pixel electrode electrically connected to the drain line by patterning the transparent conductive layer.

11. The method as claimed in claim 9, further comprising performing a doping process in the source area and the drain area of the semiconductor layer.

12. The method as claimed in claim 11, wherein the doping process comprises P-type ion doping process or N-type ion doping process.

13. The method as claimed in claim 9, further comprising performing a heavy doping process to make the source area and the drain area as heavy doped areas by applying the gate electrode as a mask.

14. The method as claimed in claim 13, further comprising:
downsizing the dimension of the gate electrode by isotropically etching the gate electrode; and
performing a light doping process in the semiconductor layer to form a light doped area in the inside of the source area and a light doped area in the inside of the drain area respectively by applying etched gate electrode as a mask.

15. The method as claimed in claim 13, wherein the heavy doping process and the light doping process comprise P-type ion doping process or N-type ion doping process.

16. The method as claimed in claim 9, wherein the semiconductor is made of a polysilicon.

* * * * *